United States Patent
Yoneda (10) Patent No.: US 7,257,140 B2
(45) Date of Patent: Aug. 14, 2007

(54) SEMICONDUCTOR LASER DEVICE

(75) Inventor: Akinori Yoneda, Anan (JP)

(73) Assignee: Nichia Corporation, Anan-shi (JP)

( * ) Notice: Subject to any disclaimer, the term of this patent is extended or adjusted under 35 U.S.C. 154(b) by 249 days.

(21) Appl. No.: 10/910,650

(22) Filed: Aug. 4, 2004

(65) Prior Publication Data
US 2005/0030999 A1    Feb. 10, 2005

(30) Foreign Application Priority Data
Aug. 4, 2003    (JP)    .............................. 2003-285813
Jun. 23, 2004   (JP)    .............................. 2004-185255

(51) Int. Cl.
*H01S 5/00*    (2006.01)
(52) U.S. Cl. ................ 372/46.01; 372/43.01
(58) Field of Classification Search ............ 372/46.01, 372/38.05, 43.01, 87, 45.01, 75, 39
See application file for complete search history.

(56) References Cited

U.S. PATENT DOCUMENTS 6,954,478 B2 * 10/2005 Nomura et al. .......... 372/46.01
6,977,953 B2 * 12/2005 Hata et al. ............... 372/46.01

FOREIGN PATENT DOCUMENTS

| JP | 3-263388 A | 11/1991 |
|---|---|---|
| JP | 7-22704 A | 1/1995 |
| JP | 8-51256 A | 2/1996 |
| JP | 10-93186 A | 4/1998 |
| JP | 10-256660 A | 9/1998 |
| JP | 2001-274511 A | 10/2001 |

* cited by examiner

*Primary Examiner*—Minsun Oh Harvey
*Assistant Examiner*—Tuan N. Nguyen
(74) *Attorney, Agent, or Firm*—Smith Patent Office

(57) ABSTRACT

A laser device is disclosed which stabilizes impedance at laser drive initiation, and in which an oscillation at low current, a high reaction speed, a low noise, and the like are achieved. A semiconductor laser device includes first and second conductive type semiconductor layers, an active layer, and first and second electrodes. The second electrode comprises an ohmic electrode and a pad electrode. The first electrode is formed on the same planar side of the first conductive type semiconductor layer as the second electrode, and is disposed in the same direction as the pad electrode with respect to the ohmically connected region. The second conductive type semiconductor layer is set to a width that can secure light confinement on both sides of the ohmically connected region.

30 Claims, 7 Drawing Sheets

PRIOR ART

SEMICONDUCTOR LASER DEVICE

BACKGROUND OF THE INVENTION

1. Field of the Invention

The present invention relates to a semiconductor laser device, and more particularly to a semiconductor laser device that employs a Group III-V nitride semiconductor.

2. Discussion of the Related Art

In recent years, semiconductor lasers have been changing to smaller, more lightweight, more highly reliable, and higher output lasers, and they have been used as a light source for electronic devices such as DVD players, medical devices, and other similar devices. For these semiconductor devices, Group III-V nitride semiconductors are studied because they are capable of generating light at relatively short wavelengths.

Figure 6:
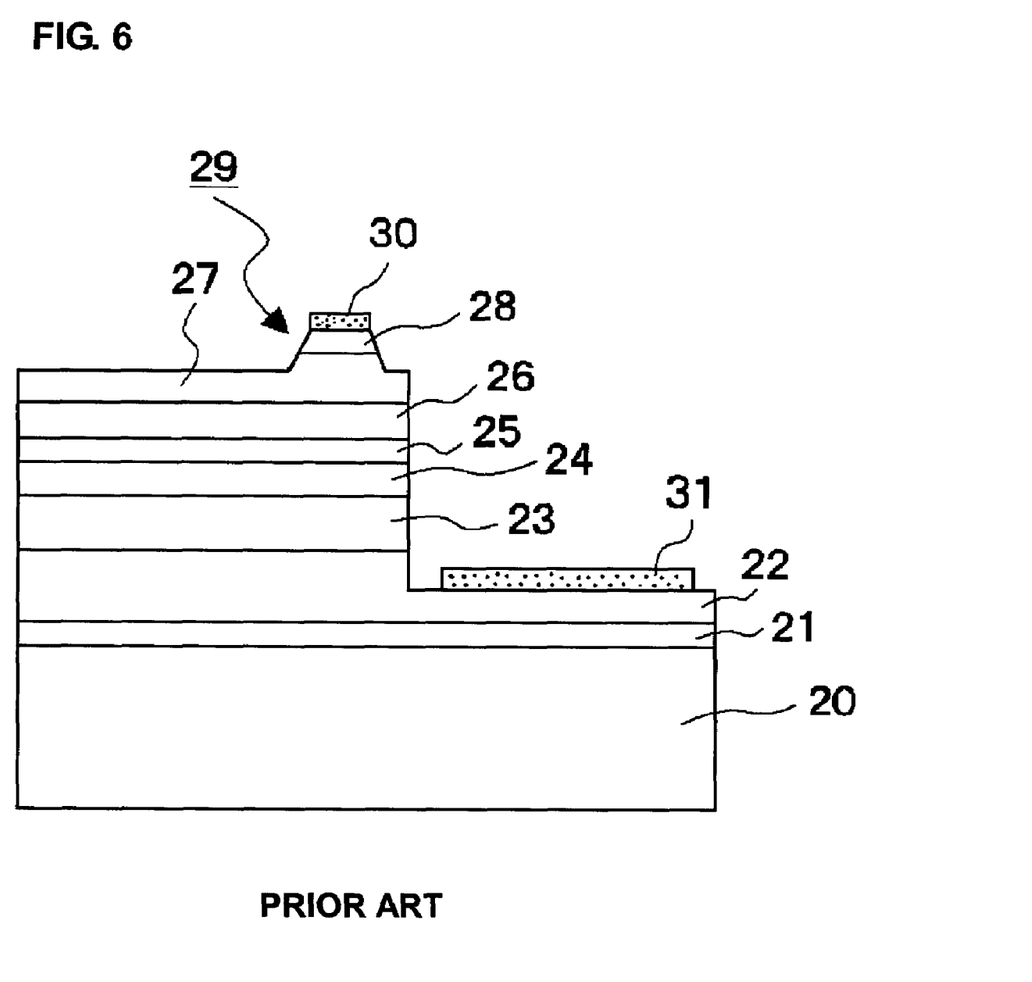
FIG. 6 is a cross sectional view showing a conventional semiconductor laser.

For example, as shown in FIG. 6, a semiconductor laser includes nitride semiconductors comprising a GaN layer 21, an n-type GaN layer 22, an n-type AlGaN cladding layer 23, an n-type GaN light confinement layer 24, an active layer 25 (e.g., an InGaN multiple quantum well layer), a p-type GaN light confinement layer 26, a p-type AlGaN cladding layer 27, and a p-type GaN layer 28 onto a sapphire substrate 20 in this order. A ridge 29 is formed by etching a portion of the p-type AlGaN cladding layer 27 in the depth direction from the surface of the p-type GaN layer 28 (see, for example, Japanese Unexamined Patent Publication No. H10-256660).

In order to prevent a rise in operating voltage that causes an increase in the electrical resistance of the n-type GaN layer 22, this semiconductor laser will reduce the series resistance added to the laser device by shortening the distance between a p-type electrode 30 and an n-type electrode 31. Also, the semiconductor laser controls the excessive rise in the temperature of the devices. This allows reducing the operating voltage and increasing the reliability of the laser device.

Even if the serial resistance of the conventional semiconductor laser is reduced as described above, this semiconductor laser cannot achieve satisfactory characteristics depending on the type of semiconductor layer that has the active layer, and there are limits on the fields in which this device can be applied.

The present invention has taken the aforementioned problems into consideration, and has objects to provide a high performance and high quality semiconductor laser device that employs any type of semiconductor. In particular, the present invention employs Group III-V nitride semiconductors, which will achieve a stabilized initial laser drive impedance, and in turn an increase in the oscillation and response speeds, a reduction in noise, and the like.

SUMMARY OF THE INVENTION

The semiconductor laser device of the present invention includes a first conductive semiconductor layer, an active layer, and a second conductive semiconductor layer, as well as a first electrode that is connected to the first conductive type semiconductor layer and a second electrode that is connected to the second conductive type semiconductor layer.

In one configuration of the semiconductor laser device:

(a) the second electrode includes an ohmic electrode and a pad electrode, the ohmic electrode is ohmically connected in a stripe shape to a portion of the second conductive type semiconductor layer, and the pad electrode has a region for wire bonding;

(b) the first electrode is formed on the same side as the second electrode with respect to the surface of the first conductive type semiconductor layer, and is disposed in the same direction as the pad electrode with respect to the ohmically connected region; and (c) the second conductive type semiconductor layer is set to a minimum required width to secure the confinement of light on both sides of the ohmically connected region.

In another configuration of the semiconductor laser device:

(a) the second electrode comprising an ohmic electrode and a pad electrode. The ohmic electrode extends in a stripe shape and is ohmically connected to a portion of the second conductive type semiconductor layer in a stripe shape. The pad electrode is electrically connected to the ohmic electrode. The pad electrode at least projects in a direction different than the direction in which the ohmic electrode extends, and has a region for electrically connecting it to an external element; and (b) the first electrode is formed on the same side as the second electrode with respect to the surface of the first conductive type semiconductor layer, and is disposed in the same direction as the pad electrode with respect to the ohmically connected region.

According to the semiconductor laser device of the present invention, the impedance during laser drive initiation can be stabilized. This allows the time needed for warm-up to be shortened, the oscillations of the laser light to occur more quickly, the loss of time to be eliminated, and a fast response time to be achieved in devices which employ a semiconductor laser. Moreover, because oscillations will quicken, the threshold value will be reduced, oscillation at a low current will be made possible, and low energy consumption can be achieved. Furthermore, the impedance during laser drive initiation can be stabilized, noise can be reduced, and a high performance and high quality semiconductor laser device can be achieved.

These objects and other objects, features, aspects and advantages of the present invention will become apparent to those skilled in the art from the following detailed description, which, taken in conjunction with the annexed drawings, discloses a preferred embodiment of the present invention.

DETAILED DESCRIPTION OF THE PREFERRED EMBODIMENTS

The semiconductor laser device according to the present invention primarily includes a first conductive type semiconductor layer, an active layer, and a second conductive type semiconductor layer. The plurality of layers includes the above layers, and further includes a first electrode that is disposed on the first conductive type semiconductor layer and a second electrode that is disposed on the second conductive type semiconductor layer. Here, the first term "first conductive type" means an n-type or a p-type, and the term "second conductive type" means a conductive type that is different from the first conductive type, i.e., a p-type or an n-type.

The first conductive type semiconductor layer, the active layer, and the second conductive type semiconductor layer are disposed in this order. Normally, the active layer and the second conductive type semiconductor layer, and optionally a portion of the first conductive type semiconductor layer in the film thickness direction, are removed, and the first conductive type semiconductor layer is configured such that it is partially exposed. The types of semiconductor layers that form these layers are not particularly limited. However, at least one of these layers, or all of the first conductive type semiconductor layer, the active layer, and the second conductive type semiconductor layer, may comprise nitride semiconductors. In addition, it is preferred that the nitride semiconductor is a Group III-V nitride semiconductor, and more particularly GaN, AlN, InN, a mixture of these crystals (e.g., $In_xAl_yGa_{1-x-y}N$, $0 \leq x$, $0 \leq y$, $x+y \leq 1$), or the like. For example, it is preferred that the first conductive type semiconductor layer is formed by an n-type nitride semiconductor layer, and the second conductive type semiconductor layer is formed by a p-type nitride semiconductor layer. However, all of the layers that are included in the first conductive type and the second conductive type semiconductor layers need not to be a conductive type that is either a p-type or an n-type.

The first conductive type semiconductor layer, the active layer, and the second conductive type semiconductor layer (particularly the nitride semiconductor layers) can be formed by means of any known method which can grow these semiconductor layers, such as MOVPE (Metal-Organic Vapor Phase Epitaxy), MOCVD (Metal-Organic Chemical Vapor Deposition), HVPE (Halide Vapor Phase Epitaxy), MBE (Molecular Beam Epitaxy), and the like.

The active layer includes a region in the interior thereof in which the flow of electricity is narrowed into a stripe shape, i.e., a waveguide region. The stripe shape is approximately parallel to the contact surfaces of the first conductive type semiconductor layer and the second conductive type semiconductor layer. The region, in which the flow of electricity is restricted (the waveguide region), is defined by a ridge (that is primarily stripe shaped) that is formed on the surface of the second conductive type semiconductor which is described below. The active layer may be a single layer or a multi-layer structure. The single layer comprises a single material such as a single chemical element or a single compound. However, a multi-layer structure comprises different materials such as a compound formed by different chemical elements, a compound formed by the same chemical element but in different ratios, or the like. These structures are preferred, and particularly comprises a quantum well structure. The quantum well structure may be a single quantum well, or may be multiple quantum wells. In addition, the active layer is preferably a nitride semiconductor layer that contains Indium. This allows laser light from the blue to red wavelengths to be obtained in the ultraviolet and visible regions.

The planar shape of the surface of the active layer is normally smaller than that of the first conductive type semiconductor layer which is described below. However, the active layer may be approximately the same as the second conductive type semiconductor layer. The active layer may also be larger or smaller than the second conductive type semiconductor layer. In addition, the active layer may be disposed on the first conductive type semiconductor layer to be offset toward one end of the laser device. The thickness of the active layer is not particularly limited. However, the thickness may, for example, be between approximately 0.01 to 1 μm. In addition, the size of the active layer is not particularly limited. However, it is preferred that the size is suitably adjusted to have the required width of the optical waveguide, i.e., the required width to confine the light. These requirements are used for the manufacturing steps of making the surface degradation and the like of the exposed surfaces, the capacity coupling with the second conductive type semiconductor layer which is described below, and the like. For example, the width may be in a range of approximately 0.5 to 20 μm, and preferably in a range of approximately 1 to 7 μm. The length of the active layer can be suitably adjusted in accordance with the light in the waveguide, the degree of resonance, and the like. For example, the resonator may have a length of 200 μm or greater.

The first conductive type semiconductor layer and the second conductive type semiconductor layer are disposed and sandwich the active layer. For example, the first conductive type semiconductor layer and the second conductive type semiconductor layer may be respectively formed as n-type and p-type cladding layers and the like. In addition to the cladding layers, one or more layers are selected from a group which includes a light guide layer, a crack prevention layer, a contact layer, a cap layer, and the like. These layers may be arranged in between the cladding layers such as the first conductive type semiconductor layer and the active layer, or the side of the cladding layers that are opposite side thereof that face the active layer. Furthermore, one or more layers are selected from a group which includes an electron confinement layer, a light guide layer, a cap layer, a contact layer, and the like. These layers may be arranged between the active layer and the cladding layer that is the second conductive layer, or on the side of the cladding layer that is opposite the side thereof that faces the active layer.

In particular, the cladding layers are preferably formed as layers which have a refractive index. The refractive index is located lower than the active layer (particularly a well layer). The cladding layers have a wide energy gap, so that they can confine light and/or confine the carrier. These layers are more preferably formed as layers which contain Al. These layers may be a single material respectively as a single layer or a multi-layer structure, or these layers may be different materials into a superlattice structure, e.g., one in which AlGaN and GaN are alternately used. Furthermore, these layers may be doped with impurities, may be undoped, and if a multi-layer structure, at least one of the layers therein may be doped. With a long wavelength semiconductor laser device in which the emission wavelength therein is the range of approximately 430 to 550 nm, these cladding layers are preferably GaN doped with p-type impurities (e.g., Mg, Zn, Cd, Be, Ca, Ba, and the like) in the p-type layer, and n-type impurities (e.g., Si, Sn, Ge, Se, C, Ti, and the like) in the n-type layer. The thickness of these layers is not particularly limited, and may be in the range of, for example, approximately 10 nm to 5 µm. Furthermore, a thickness in the range of approximately 50 nm to 2 µm will have a satisfactory light confinement effect.

The electron confinement layer is preferably disposed between the p-type cladding layer and the active layer, and can, for example, be formed with AlGaN. AlGaN is doped with a p-type impurity, and the like. This allows increasing a carrier confinement effect on the active layer. The threshold current of the semiconductor laser device is obtained to be reduced, and will make it easier to obtain oscillations. The thickness thereof may be, for example, approximately 50 nm or less.

By disposing guide layers on both sides of the active layer so that the guide layers sandwich the active layer, a current restriction region, i.e., a waveguide, can be secured by this structure. The thickness of the guide layers is not particularly limited. However, if the guide layers are disposed on both sides of the active layer, it is preferred that both guide layers have the same thickness. For example, the thickness of the guide layers may be in the range of approximately 10 nm to 1 µm, and preferably in the range of approximately 50 nm to 200 nm. Compared to the semiconductor layers that are arranged on the outer sides thereof, i.e., the cladding layers described above, the semiconductor layers that form the guide layers preferably have a refraction index sufficiently high to form the waveguide. Each guide layer may be formed with a single material such as a single layer or a multi-layer structure, or may be formed with different materials as a multi-layer structure. For example, with an emission wavelength between 370 nm and 470 nm, undoped GaN is preferred, and with a comparatively long wavelength region (e.g., 450 nm or greater), layers that contain Indium are preferred. More specifically, it is preferred to employ guide layers comprising InGaN alone, or multi-layer guide layers comprising a superlattice that contains InGaN, e.g., InGaN/GaN, InGaN/AlGaN, or InGaN/InGaN (layers having different composition ratios). Note that sudden increases in the emission threshold current can be controlled by setting the guide layers so that the thickness of the active layer and the current restriction region is approximately 600 nm or less. Furthermore, when the thickness is approximately 450 nm or less, a reduced emission threshold current can extend the life of a semiconductor laser device which produces a continuous emission in a standard mode.

It is preferred that a stripe shaped ridge is formed on the surface of the second conductive type semiconductor layer. The ridge may have a mesa shape in which the width of the bottom surface thereof is wide and then gradually becomes narrower toward the upper surface thereof to form a small stripe width. A reverse mesa shape is that the width of the stripe gradually becomes smaller toward the bottom surface of the ridge. A shape described above can be that lateral surfaces are perpendicular to the laminated surface, and also, the shape can be a combination of these shapes as described above. The width of the ridge is not particularly limited, but may be in a range of approximately 1 to 7 µm. The height of the ridge can be suitably adjusted depending upon the thickness of the second conductive type semiconductor layer. The height of the ridge may, for example, be between approximately 0.2 to 1 µm. Note that the width of the ridge need not be the same in the longitudinal direction or the direction of the resonator.

It is important that the stripe shaped ridge is disposed so that a satisfactory or a desirable region is secured on one directional side of the current restriction region. The current restriction region is defined by the ridge in order to perform wire bonding to the pad electrode that forms part of the second electrode, which is described below, or in order to electrically connect the pad electrode to an exterior unit (hereinafter simply referred to as "for wire bonding and the like"). In other words, the wire bonding and the like that extends directly on top of the ridge may cause damage such as cracking or chipping to the ridge itself due to the pressure that occurs during the wire bonding and the like. Thus, in order to avoid the wire bonding and connectors that extend directly on the top of the ridge, it will be necessary to be disposed on the current restriction region, i.e., the ridge, on one side and secure a satisfactory or desirable region in which the wire bonding and the like can be performed. Because of this situation, when the entire laser device is grasped, it is normally preferred that the ridge is offset and is disposed on the side thereof, opposite the side being grasped. This allows a satisfactory region to be secured on one side of the ridge in order for the wire bonding and the like to be performed on the pad electrode.

The specific position of the ridge can be suitably adjusted based upon the size of the semiconductor laser device itself. For example, it is preferred that the ridge is disposed from the ends in the width direction of the second conductive type semiconductor layer in a range within approximately 2 to 50 times, more preferably approximately 2 to 30 times, and even more preferably approximately 2 to 10 times, the width of the ridge. In addition, the ridge may be disposed so that the minimum distance between the end of the ridge and the end of the first electrode, which is described below is approximately 300 µm or less, preferably 200 µm or less, more preferably approximately 100 µm or less, and even more preferably approximately 50 µm or less. Except for the region in which the wire bonding is to be performed, it is preferred that the ridge is extended in the direction of the resonator to approximately the center of the second conductive type semiconductor. In addition, if the semiconductor laser device is an array laser on which a plurality of ridges are formed, it is preferred that the ridge region (the collection of the ridges) is disposed from the ends in the width direction of the second conductive type semiconductor layer in a range within approximately 2 to 50 times, preferably approximately 2 to 30 times, and more preferably approximately 2 to 10 times, the width of the ridge region. The minimum distance between the ridge region and the first electrode may be such that the distance between the first electrode and the closest ridge is the same as the distance from the aforementioned single ridge to the first electrode.

The second conductive type semiconductor layer is electrically connected to the active layer as described above, and it is preferred that the capacity between the active layer and the second conductive type semiconductor layer (or in addition between the active layer and the first conductive type semiconductor layer) is set so that the frequency and impedance characteristics are not hindered. The phrase "frequency and impedance characteristics are not hindered" normally means that the impedance will not be reduced as the frequency increases. Also, it can mean that the impedance will not change or increase as the frequency increases. In addition, as described above, because the second conductive type semiconductor layer is normally formed to have a planar shape and has a surface area that is approximately the same as the active layer, the upper surface area of the second conductive type semiconductor layer will not affect the emission of laser light in the active layer. The second conductive type semiconductor layer will have a width that can secure light confinement (preferably the minimum width). Furthermore, the second conductive type semiconductor layer may have a structure such that the capacity between the active layer and the second conductive type semiconductor layer is low (preferably the minimum capacity). This makes it possible for a device to be obtained in which the impedance at drive initiation is stable, the laser light is more quickly emitted, the warm-up time is shortened, the time loss is eliminated, and the response speed is fast. Moreover, a device can be obtained that reduces the threshold value, can emit at a low current, and has a low power consumption.

The planar shape of the second conductive type semiconductor layer is not limited to a rectangular shape, and may have a polygon shape, a round shape, an elliptical shape, and the like or any other shape. These shapes are together with a shape of the pad electrode which is described below, and the pad electrode may have a shape that projects in a direction that is different than the direction of the resonator. Above all, it is preferred that the two surfaces that form the resonator be mutually parallel, more preferred that the lateral surfaces thereof are also mutually parallel, and even more preferred that the second conductive type semiconductor layer is rectangular.

When the adequately required region for the wire bonding and the like of the pad electrode is not considered, in the present invention, the region of the second conductive type semiconductor layer corresponds to the waveguide or the current restriction region, or the region of the second conductive type semiconductor layer including the waveguide or the current restriction region and the outer periphery of this region that primarily has functions that are expected as a normal second conductive type semiconductor layer. This width of the region is expressed as the width of the second conductive type semiconductor layer (e.g. W of FIG. 1). In addition, as shown in FIGS. 3A, 3E, 3G, 3I, and 3J, this width can be the width that approximately corresponds to the second electrode that is shown by the arrow M or a width that is slightly larger than the second electrode.

Furthermore, after the stripe shaped ridge is formed on the surface of the second conductive type semiconductor layer, semiconductor crystals may be grown on both sides of the ridge to form an embedded structure.

Figure 3A:
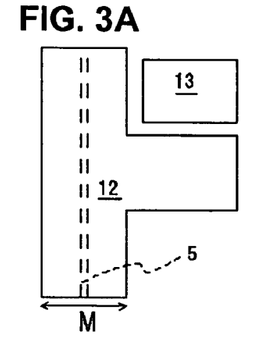
FIGS. 3A-3N are plan views showing various configurations of a first electrode and a second electrode of the semiconductor laser according to the present invention.
Figure 3B:
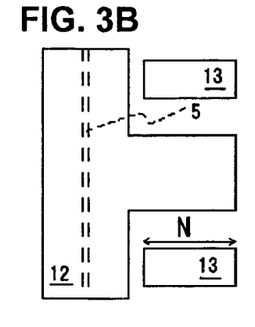
Figure 3C:
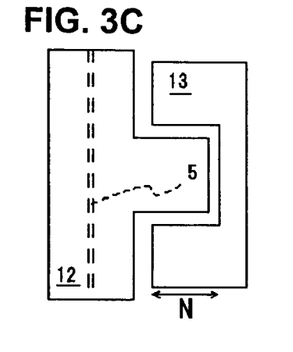
Figure 3D:
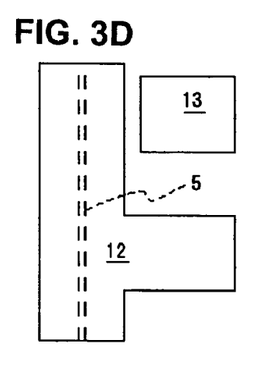
Figure 3E:
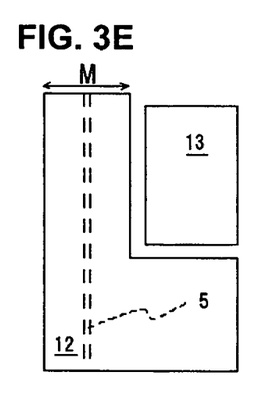
Figure 3F:
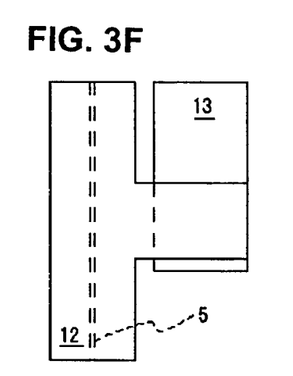
Figure 3G:
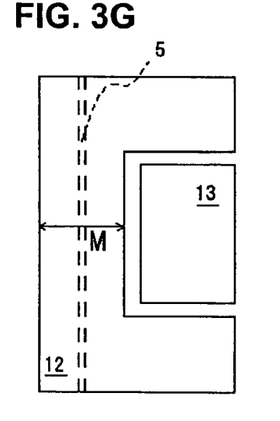
Figure 3H:
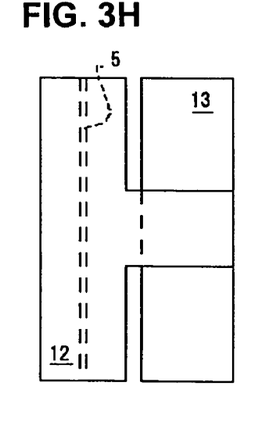
Figure 3I:
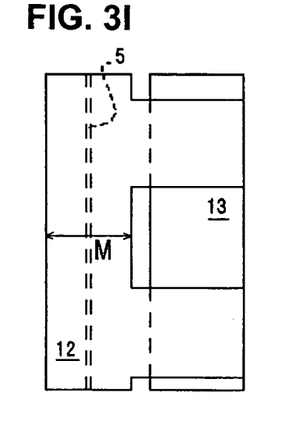
Figure 3J:
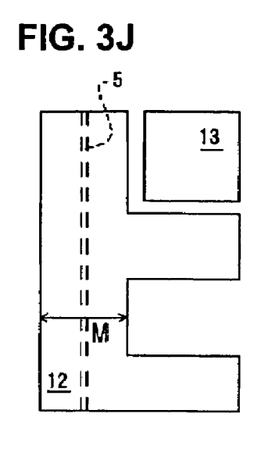
Figure 3K:
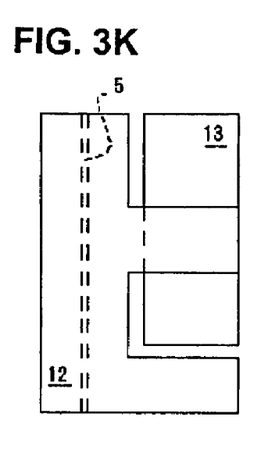
Figure 3L:
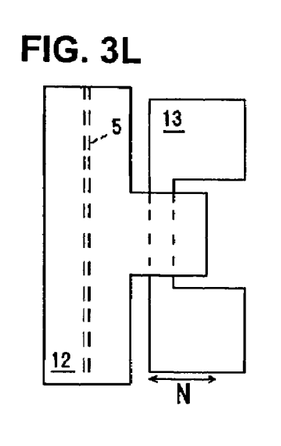
Figure 3M:
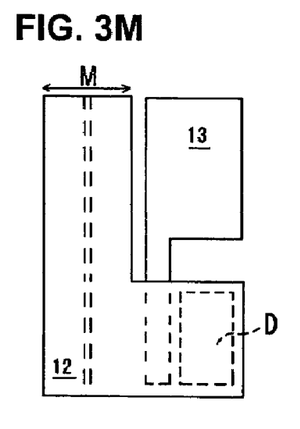
Figure 3N:
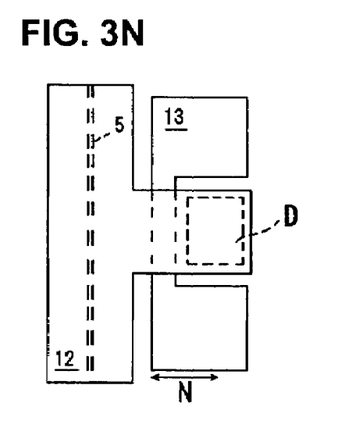

In the present invention, the structure of the plurality of layers such as the first conductive type semiconductor layer, the active layer, and the second conductive type semiconductor layer may be one that can reduce the heat capacity produced in the laser device. For example, the active layer may have a surface area considerably larger than the second conductive type semiconductor layer, but the active layer may be divided into a region that functions as a conventional active layer that has approximately the same size as the second conductive type semiconductor layer, and a region in the entirety of which current will not substantially flow. The first conductive type semiconductor layer and the second conductive type semiconductor layer may also be divided, together with the active layer or individually, so that current does not substantially flow therein. In other words, the first conductive type semiconductor layer, the active layer, and/or the second conductive type semiconductor layer may be formed as a so-called dummy layer that does not function as a portion of the laser device structure, does not contribute to laser emission, or the dummy layer is electrically divided (see, for example, D in FIGS. 3M and 3N). Note that the dummy layer may be formed separately from the first conductive type semiconductor layer, etc. Due to the presence of the dummy layer, if the second electrode is formed on top thereof, uneven surfaces will be reduced, and the disconnection of the second electrode can be effectively prevented. In addition, for example, parallel face down mounting can be performed very well because the capacitance will not be increased, and the uneven surfaces will be reduced. Furthermore, the dummy layer can be efficiently formed by etching down to the surface of the first conductive type semiconductor layer in order to form the first electrode, but allowing a portion of the second conductive type semiconductor and the active layer to remain. However, the dummy layer does not necessarily have to be a semiconductor layer, and can be formed by another material. This also allows the uneven portions to be reduced.

Normally, the first electrode and the second electrode are formed so that at least one portion thereof is electrically connected to the first conductive type semiconductor layer and the second conductive type semiconductor layer, respectively. The materials from which the electrodes are formed are not particularly limited so as long as they are conductive materials, and it is preferred that the materials provide an ohmic connection with the first conductive type semiconductor layer and the second conductive type semiconductor layer. For example, the electrodes can be formed into a single layer or multiple layers of metal such as aluminum, nickel, gold, silver, copper, chrome, molybdenum, titanium, indium, gallium, tungsten, platinum group materials (e.g., Pt, Rh, Pd, Ir, Ru, Os, and the like), conductive oxides such as ITO, ZnO, and $SnO_2$, and the like. More specifically, examples of the electrode materials of the second electrode include Ni—Au, Ni—Au—Pt, Pd—Pt, and Ni—Pt, and examples of the electrode materials of the first electrode include Ti—Al, V—Pt, Ti—Al—Ti—Pt, W—Al—W, and Ti—Mo—Ti—Pt. These electrodes can, for example, be formed at a thickness of approximately 100 nm to 10 μm.

It is preferred that the second electrode is formed from an ohmic electrode that is ohmically connected to a portion of the second conductive type semiconductor layer and a pad electrode. This is because a device having superior reliability can be obtained by dividing the two functions of the second electrode, i.e., improvement of the ohmic capability of the semiconductor and the alignment of the wire. If the ohmic electrode and the pad electrode are laminated, it is preferred that the same material is disposed on the interface between the two layers. It is particularly preferred that a platinum group material is disposed at that location. In addition, the second electrode may have a portion that is ohmically connected and a portion that functions as a pad electrode, i.e., the second electrode may be integrally formed so that it functions as both an ohmic electrode and a pad electrode. With this configuration, it may not be necessary that both electrodes are separated, thus allowing the manufacturing process to be simplified. However, the interface state that is formed between the ohmic electrode and the pad electrode can be eliminated, and an electrode having lower resistance can be obtained. The ohmic electrode and the pad electrode may be formed with the same material, or may be formed with different materials. Note that, for example, after the second electrode is formed with an Ni—Au electrode material, nickel oxide formed in the portion that will be the pad electrode may be removed by etching.

The ohmic electrode extends in the direction in which the current restriction region extends, i.e., the direction of the resonator, and is ohmically connected to approximately a portion or the entire surface of the second conductive type semiconductor layer, and is preferably connected directly on top of the ridge as described above. The length of the ohmic electrode in the direction of the resonator can be suitably adjusted based upon the size of the second conductive type semiconductor layer and/or the size of the semiconductor laser device. The width (length) of the ohmic electrode in the horizontal direction (perpendicular to the resonator) may be set to a width that covers only the upper surface of the ridge formed on the surface of the second conductive type semiconductor layer, or may be set to a width that also covers both lateral surfaces of the ridge, or also covers a portion or all of the second conductive type semiconductor layer on both sides of the ridge. This allows a voltage to be sufficiently and uniformly applied in the waveguide, and allows a current to be supplied therein. Note that the ohmic electrode may be formed asymmetrically with respect to the ridge, but it is preferred that the ohmic electrode is formed symmetrically with respect thereto.

If the pad electrode is electrically connected to at least the ohmic electrode, the pad electrode may be disposed and may be in contact with a portion or the entire surface of the ohmic electrode. In addition, the region in which the second conductive type semiconductor layer and the ohmic electrode are ohmically connected may be disposed such that a satisfactory region for wire bonding and the like is secured substantially on one side thereof. Here, the phrase "satisfactory region for wire bonding and the like" means the region where the ridge is not present and wire bonding and the like can be performed, so that wire bonding and the like is not performed on top of the ridge. Note that when wire bonding and the like is pressed and formed, the bonding material spreads out from the portion on which weight was added, and the outer periphery of the bonding material may overlap on the top of the ridge. However, in this situation, it is preferred that the region be disposed such that a satisfactory region is secured, and so that the bonding material will not overlap on the top of the ridge. More specifically, the thickness and the material of the wire that is to be bonded and the like can be suitably adjusted based upon the materials of the pad electrode, the surface area of the region may be, for example, 1000 $\mu m^2$ or greater, preferably 2000 $\mu m^2$ or greater, more preferably 5000 $\mu m^2$ or greater, even more preferably approximately 5000 to 20000 $\mu m^2$, and yet more preferably approximately 7000 to 12000 $\mu m^2$. In addition, viewed another way, the size of the region may be approximately 30 $\mu m \times 30$ $\mu m$ to 200 $\mu m \times 200$ $\mu m$, and preferably approximately 80 $\mu m \times 80$ $\mu m$ to 120 $\mu m \times 120$ $\mu m$. Viewed yet another way, if for example the length of the resonator is 200 $\mu m$ or greater, the total width of the ohmic electrode and the pad electrode may be approximately 100 to 200 $\mu m$ or greater.

In order to secure the region noted above, it is preferred that the pad electrode have a shape that projects at least in a direction that is different than the direction in which the ohmic electrode extends. In other words, as described above, the current restriction region normally causes a deviation in the position in which the ridge is formed inside the semiconductor laser device, and is offset toward one end of the laser device. Thus, the pad electrode is disposed on one directional side of the current restriction region, i.e., on one directional side of the region in which the second conductive type semiconductor layer and the ohmic electrode are ohmically connected (see FIGS. 3A to 3L). Furthermore, it is preferred that the pad electrode is disposed and projects from the ohmic electrode on the side in which the first electrode is formed with respect to the ridge. As described above, this allows damage such as a chipping of the ridge during wire bonding and the like to be avoided, and allows current to be reliably and satisfactorily provided to the second electrode without short circuiting and the like. Note that the wire bonding and the like may be performed on the dummy layer as described above. This allows reduced damage to the semiconductor layers or the electrodes that form the laser device.

Figure 2A:
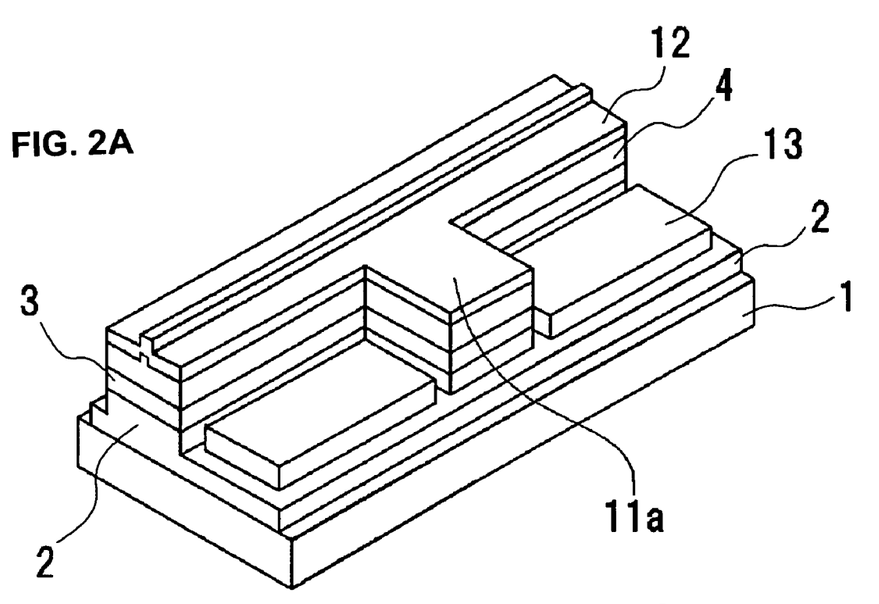
FIG. 2A is a perspective view showing a semiconductor laser device according to the embodiment shown in FIG. 1 with some layers removed for clarity.
Figure 2B:
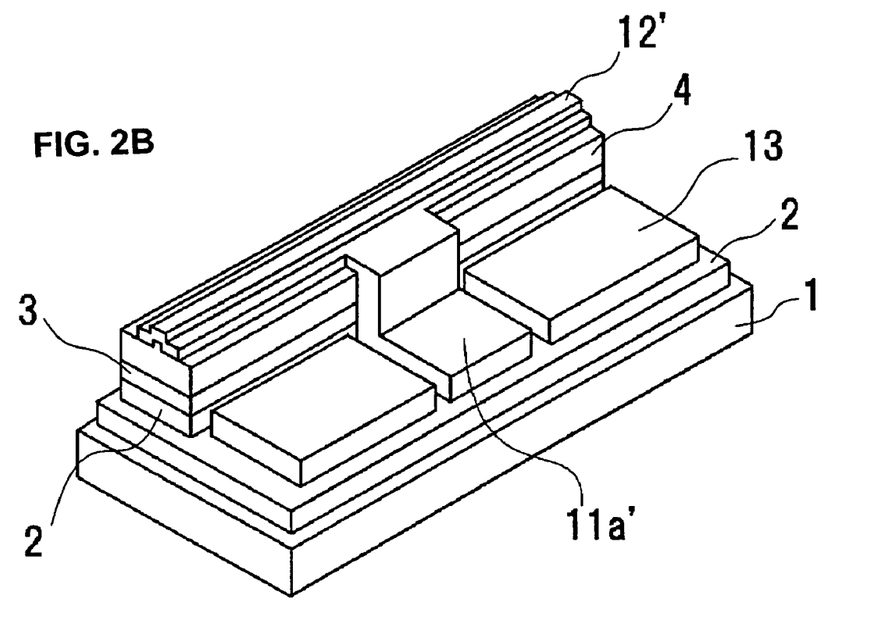
FIG. 2B is a perspective view showing a semiconductor laser of a further embodiment according to the present invention.

In addition, as shown in FIG. 2A, the second electrode may be set to have approximately the same planar shape and surface area as the second conductive type semiconductor layer, and the entire portion thereof may be in contact with the second conductive type semiconductor layer. However, it is preferred that the second electrode is in contact with a portion of or the entirety of the ohmic electrode. With this configuration, it is preferred that the second electrode is disposed on the second conductive type semiconductor layer through an insulating film or the like that is disposed adjacent to the second electrode. In addition, as shown in FIG. 2B, the second electrode may be extended to the first conductive type semiconductor layer in a state in which it is not electrically connected thereto (i.e., through an insulating film). However, FIGS. 2A and 2B serve to describe the shape of the second electrode, and thus the insulating film is omitted therefrom. Here, examples of the insulating film include single or multi-layer structures such as silicon oxide, titanium oxide, zirconium oxide, hafnium oxide, niobium oxide, and the like. This film may not only serve as an insulating film, but may also serve to protect exposed layers or lateral surfaces. In addition, the pad electrode may not only be disposed on the semiconductor laminated structure as shown in FIGS. 2A and 2B. However, for example, one portion or the entirety of the semiconductor laminated structure on which the pad electrode is disposed may be formed in a stepped shape, or the region on which the pad electrode is disposed may be formed into a stepped shape by means of insulating film, protective film, or the like.

The first electrode is electrically connected to the first conductive type semiconductor layer, and is formed on the same planar side as the second electrode with respect to the surface of the first conductive type semiconductor layer. In other words, as shown in the plan view of the semiconductor laser devices in FIGS. 3A to 3N, the first electrode 13 is disposed on the same planar side as the second electrode 12. In this configuration, the first electrode may overlap with the second electrode but not be in electrical contact with each other due to the presence of an insulating film and the like (see, for example, FIGS. 3F, 3H, 3I, 3K, and FIGS. 3L, 3M, and 3N). This shape allows the injection efficiency of the current to be enhanced because the size of the first electrode can be increased.

In addition, the first electrode is disposed only in the same direction with respect to the current restriction region (or the ridge 5) as the region for wire bonding and the like of the pad electrode. In other words, the first electrode is disposed and is adjacent to the ohmic electrode of the second electrode. The first electrode is disposed and is adjacent to the pad electrode disposed to project from the ohmic electrode. For example, the first electrode can be on one side with respect to the direction in which the ohmic electrode extends, and can be disposed on one of the two opposing end surfaces of the semiconductor laser device. In this configuration, the pad electrode is on one side with respect to the direction in which the ohmic electrode extends, and is disposed on the other of the two opposing end surfaces of the semiconductor laser device. More specifically, the second electrode may be formed into an L shape by means of the pad electrode that projects therefrom, and the first electrode may be square or close thereto and be disposed and be surrounded by the pad electrode in two directions (see, for example, FIG. 3E). In addition, if the second electrode is formed into a T shape by means of the pad electrode that projects therefrom, the first electrode can be a square, a shape that is close thereto, or a shape that is divided into two portions. Here, the phrase "shape that is divided into two portions" means, among other things, a shape in which the first electrode is divided into two squares (see, for example, FIG. 3B), or a shape that is divided into two regions that are electrically connected (see, for example, FIGS. 3C, 3L, and 3N).

If the second electrode is formed into a C shape, an F shape, or a shape close thereto by means of the pad electrode that projects from the second electrode, the second electrode may be disposed so as to surround the first electrode and/or partially cover the first electrode (see, for example, FIGS. 3G, 3I, 3J, and 3K). Note that regardless of the shape of the pad electrode, the first electrode may sandwich the pad electrode in the direction in which the ohmic electrode extends, may be overlapped, and may be divided into two portions.

Except for the region on the second electrode that is maintained for wire bonding and the like, the width of the first electrode may be in a range of approximately ½ to 10 times the width of the second electrode, and more preferably in a range of approximately 1 to 5 times the width of the second electrode. Here, for example, the width of the second electrode can be represented by the arrow M in FIGS. 3A, 3E, 3G, 3I, and 4J, and the width of the first electrode can be represented by the arrow N in FIGS. 3B and 3C. These ranges are applied to structures in which the width of the second electrode is larger than the width of the ridge, e.g., structures in which the second electrode is formed on top of a protective film that is formed on the lateral surfaces of the ridge. This second electrode can be formed by sputtering after the formation of the ridge. In addition, if the second electrode is formed with a self-alignment method, the width of the ridge will be approximately the same as the width of the second electrode, and thus the first electrode may have a width in a range approximately 10 to 120 times the width of the second electrode, and preferably in a range of approximately 30 to 80 times the width of the second electrode, not including the region that is maintained for wire bonding and the like on the second electrode.

The semiconductor laser device of the present invention may have the first conductive type semiconductor layer, the active layer, and the second conductive type semiconductor layer laminated in this order on a substrate. The substrate may be an insulating substrate, a semi-insulating substrate, or a conductive substrate. Examples of these substrates include sapphire, spinel, ZnS, ZnO, GaAs, Si, SiC, AlN, and an oxide substrate having a lattice matched with the nitride semiconductor, the main surface of which having a C, R, or A-plane. Above all, it is preferred that the substrate is capable of growing a nitride semiconductor, and examples of this type of substrate include sapphire and spinel. The substrate may be off-angled, and in this configuration it is preferred that the off-angled substrate have a stepped shape because layers composed of gallium nitride will crystallize well thereon. Note that the substrate may be removed by means of grinding and polishing and the like after the semiconductor layers such as a buffer layer, an underlying layer, and the like are grown on the substrate, and prior to forming the first conductive type semiconductor layer and the like on the substrate, or may be removed after the device structure has been formed. The growth of the first conductive type semiconductor can be improved by forming a buffer layer, the underlying layer, and the like.

If a nitride semiconductor, which has been epitaxially laterally overgrown (ELO), is employed as the underlying layer, a substrate having excellent crystallization can be obtained. One specific example of an ELO layer includes one in which a mask region which provides a protective film that controls the growth of a nitride semiconductor on the surface of a substrate and a non-mask region that causes a nitride semiconductor to grow on a substrate are arranged in stripe shapes on the substrate. The nitride semiconductor is grown and deposited on the mask region by adding to the growth thereof in the film thickness direction in order to cause growth in the horizontal direction and thus causing the nitride semiconductor to grow from the non-mask region. Another specific example of an ELO layer is one in which an opening is provided in a nitride semiconductor grown on a substrate, and growth and deposition occurs from the surface of the opening in the horizontal direction, i.e., one in which selective growth was used.

In addition, in the semiconductor laser device of the present invention, an end surface protective film, e.g., Si, Mg, Al, Hf, Nb, Zr, Sc, Ta, Ga, Zn, Y, B, Ti, and oxides thereof, nitrides (e.g., AlN, AlGaN, BN, and the like), and fluorine compounds may be formed on the surface of the resonator so that the light generated in the active layer resonates with good efficiency. Note that the aforementioned materials may be used individually, a plurality of compounds may be combined together and used, or a multi-layer film that is a combination of a plurality of these materials may be used.

Note also that the semiconductor laser device of the present invention can also be formed by means of any method of producing a standard semiconductor laser. For example, in order for the direction in which the current restriction region extends (the direction in which the ridge of the second conductive type semiconductor layer extends) to be the same as the direction of the resonator, a pair of resonator surfaces that are arranged on the end surfaces may be formed by either cleavage or etching (the RIE method or the like). In addition, it is also possible for one to be a cleavage surface and the other to be an etching surface. In the event that a surface is to be formed by the cleavage, the substrate and the semiconductor must have the ability to be cleaved, and a superior mirror surface can be easily obtained when this ability to be cleaved is used. With formation by etching, the resonator surface may be formed at the same time as the first electrode formation surface is exposed (the detail is described below). In addition, when the ridge is to be formed on the surface of the second conductive type semiconductor layer, the so-called self-alignment method may be used. In other words, an insulating film or a protective film such as silicon oxide may be used as a mask during etching, and a metal film may be formed into a shape that corresponds to the ridge that one is trying to obtain. This metal film may be employed as a mask to form the ridge, and then this metal film may be used as the second electrode. Furthermore, when the ohmic electrode and the pad electrode that form the second electrode and the first electrode are to be formed, an insulating film or a protective film of silicon oxide or the like or a photoresist may be formed and used as a mask, and the photoresist may be used with the lift-off method.

In addition, the semiconductor layer device of the present invention may be mounted with either a face-up mounting (i.e., the substrate side facing the submount substrate), or a face-down mounting (i.e., the ridge side facing the submount substrate). Here, metallization layers (bumps: Ag, Au, Sn, In, Bi, Cu, Zn, and the like) that serve to connect with external electrodes and the like are respectively formed on top of the p-electrode and the n-electrode, and these metallization layers are respectively connected to a pair of positive and negative external electrodes that are provided on the submount. Furthermore, wire or the like is laid out with respect to the submount substrate. In the event that face-down mounting is to be performed, the circuits on the circuit board that are on the side thereof to be mounted can be simplified. This allows a plurality of laser devices to be densely mounted on the same substrate. For example, viewed from the ohmic electrode, the same laser device can be mounted in a direction opposite that of the direction in which the pad electrode projects (the pad electrode projecting in a direction different than the direction in which the stripe shaped ohmic electrode extends). In addition, a red laser device and an infrared laser device can be mounted. Moreover, heat dissipation can be improved because the ridge side that produces heat is positioned near the submount substrate.

Embodiments of the semiconductor laser device of the present invention will be described in detail below with reference to the figures.

Embodiment 1

Figure 1:
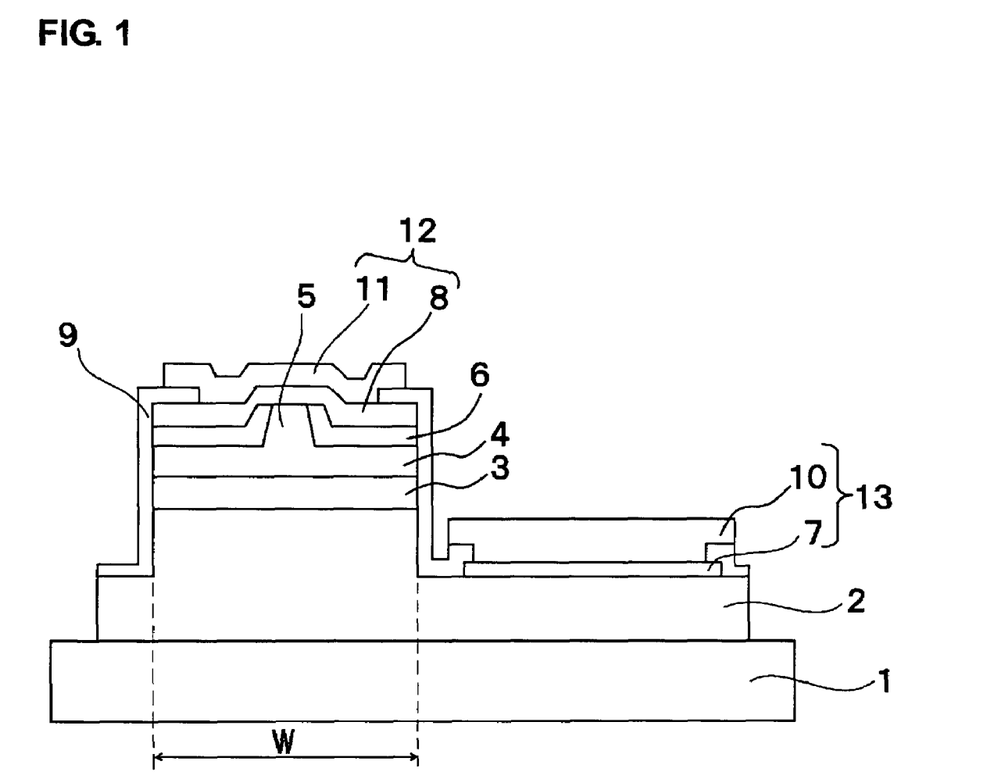
FIG. 1 is a cross sectional view showing a semiconductor laser device of an embodiment according to the present invention.

As shown in FIGS. 1 and 2A, the semiconductor laser device of this embodiment is formed by sequentially laminating an n-type semiconductor layer 2 that is the first conductive type semiconductor layer, an active layer 3, and a p-type semiconductor layer 4 that is the second conductive type semiconductor layer on a substrate 1.

A portion of the n-type semiconductor layer 2 is removed in the film thickness direction, as well as portions of the active layer 3 and the p-type semiconductor layer 4 disposed thereon. In addition, a stripe shaped ridge 5 is formed on the upper surface of the p-type semiconductor layer 4.

A first insulating film 6 is formed on the upper surface of the p-type semiconductor layer 4, and covers the lateral surfaces of the ridge 5 but not the upper surface thereof. In addition, an n-type ohmic electrode 7 that is partially connected with the n-type semiconductor layer 2 is formed on the upper surface of the n-type semiconductor layer 2 from which the active layer 3 and the p-type semiconductor layer 4 were removed, and a p-type ohmic electrode 8 that is connected to the upper surface of the ridge 5 is formed on the upper surface of the ridge 5. Except for portions of the n-type and p-type ohmic electrodes 7, 8, a second insulating film 9 is covered on the surface of the n-type semiconductor layer 2 and the p-type semiconductor layer 4. Furthermore, an n-type pad electrode 10 and a p-type pad electrode 11 are formed on top of the n-type ohmic electrode 7 and the p-type ohmic electrode 8 so that portions thereof connect with the ohmic electrodes 7, 8, and respectively form a first electrode 13 and a second electrode 12.

Note that the ridge 5 is disposed to be offset strongly toward one side of the laser device. For example, with a device having an overall width of 200 to 240 µm, a p-type semiconductor layer width of approximately 60 µm (e.g., the width M shown in FIG. 3A), and a waveguide stripe length of approximately 600 to 650 µm, and with the end portion of the p-type semiconductor layer arranged so as to be set back from the end of the device approximately 10 µm, the ridge will be disposed in a position approximately 40 µm from the end of the device and approximately 30 µm from the end of the p-type semiconductor layer. The width of the ridge 5 in this configuration is approximately 1.5 µm, and the height thereof is approximately 0.5 µm.

Note that although not shown in FIGS. 1 and 2A, in the event that the p-type semiconductor end portion is aligned with the end of the device, the ridge may be disposed in a position that is approximately 30 µm from the end of the device and the end of the p-type semiconductor layer 4.

In addition, as shown in FIG. 2A, the p-type pad electrode 11 is formed as a projection 11a in the approximate center of the semiconductor laser device on one directional side of the ridge 5, i.e., on the side on which the first electrode 13 is disposed, in order to maintain a satisfactory region for wire bonding. The projection 11a allows the n-type ohmic electrode 7 and the n-type pad electrode 10 to be divided into two portions. The first pad electrode in this configuration will be 110 µm×200 µm.

The semiconductor laser device described above can be formed by the following method.

Substrate

First, a sapphire substrate having a 2 inch diameter, whose primary plane is a C-plane, is set into a MOVPE reaction chamber, heated to a temperature of 500° C., and trimethylgallium (TMG) and ammonia ($NH_3$) are employed to grow a buffer layer composed of GaN having a film thickness of 200 Å. After formation of the buffer layer, the temperature is raised to 1050° C., and TMG and ammonia are employed to grow a nitride semiconductor layer comprising undoped GaN at a film thickness of 4 µm. This layer acts as an underlying layer (growth substrate) in the growth of each layer that forms the device structure.

Formation of the First Conductive Type Semiconductor Layer

Next, TMG, ammonia, and silane gas as an impurity gas are employed at 1050° C. to form an n-type contact layer that is comprising GaN doped with Si at $1\times10^{18}/cm^3$ on the ground layer at a film thickness of 4.5 µm.

TMG, TMI (trimethylindium), and ammonia are used at a temperature of 800° C. to grow a crack prevention layer composed with $In_{0.06}Ga_{0.94}N$ at a film thickness of 0.15 µm. Note that this crack prevention layer can be omitted.

The temperature is then increased to 1050° C., TMA (trimethylaluminum), TMG, and ammonia are employed in a gas to grow an A layer comprising undoped AlGaN at a film thickness of 25 Å on top of the crack prevention layer. The TMA is then stopped, silane gas is employed as an impurity gas, and a B layer comprising GaN doped with Si at $5\times10^{18}/cm^3$ is grown to a film thickness of 25 Å on top of the A layer. These steps are respectively repeated 160 times to sequentially laminate A layers and B layers on top of each other and grow an n-type cladding layer comprising multiple layers (a superlattice structure) having a total film thickness of 1.2 µm. At this point, if the mixed crystal ratio of Al in the undoped AlGaN is in a range between 0.01 and 0.03, a refractive index difference that will function as a satisfactory cladding layer can be provided.

Next, TMG and ammonia are employed in a gas at the same temperature to grow an n-type guide layer comprising undoped GaN at a film thickness of approximately 0.15 to 0.17 µm. This layer may be doped with an n-type impurity.

Formation of the Active Layer

Next, the temperature is set to 800° C., and TMI (trimethylindium), TMG, and ammonia are employed in a gas and silane gas is employed as an impurity gas to grow a barrier layer composed of $In_{0.05}Ga_{0.95}N$ and doped with Si at $5\times10^{18}/cm^3$ at a film thickness of 140 Å. Then, the silane gas is stopped, and a undoped well layer composed of $In_{0.1}Ga_{0.9}N$ is grown at a film thickness of 70 Å. These steps are repeated two times, and a barrier layer is laminated last to grow an active layer having a multiquantum well structure (MQW) with a total film thickness of 560 Å.

Formation of the Second Conductive Type Semiconductor Layer

Next, at the same temperature, TMA, TMG, and ammonia are used in a gas, and Cp$_2$Mg (cyclopentadienyl magnesium) is used as an impurity gas, to grow a p-type electron confinement layer composed of AlGaN doped with Mg at $1\times10^{19}/cm^3$ at a film thickness of 100 Å.

Then, the temperature is increased to 1050° C., and TMG and ammonia are used in a gas to grow a p-type light guide layer composed of undoped GaN at a film thickness of 1500 Å. This p-type light guide layer is undoped, but may be doped with Mg.

Next, at 1050° C., an undoped layer comprising undoped Al$_{0.16}$Ga$_{0.84}$N is grown at a film thickness of 25 Å, the TMG is stopped, and Cp$_2$Mg is employed to grow a layer composed of Mg doped GaN at a film thickness of 25 Å, which will grow a p-type cladding layer comprising a superlattice layer having a total film thickness of 0.45 μm. In the event that the p-type cladding layer is produced with a superlattice that includes two laminated nitride semiconductor layers having mutually different band-gap energies and in which at least one of the layers contains Al, crystallization will tend to be good if at least one of the layers is heavily doped with impurities, i.e., if modulated doping is performed. However, both layers may doped in the same way.

Finally, a p-type contact layer comprising GaN doped with Mg at $1\times10^{20}/cm^3$ is grown on top of the p-type cladding layer at 1050° C. and at a film thickness of 150 Å. The p-type contact layer can be formed with p-type In$_x$Al$_{1-x-y}$Ga$_{1-x-y}$N ($x \leq 0$, $y \leq 0$, $x+y \leq 1$), and Mg doped GaN is preferable in order to obtain the most preferred ohmic contact.

After the reaction is completed, the wafer is annealed in the reaction chamber in a nitrogen atmosphere at 700° C. to further lower the resistance of the p-type semiconductor layer.

Exposure of the First Conductive Type Semiconductor Layer

The wafer obtained as described above is removed from the reaction chamber, and an etching mask comprising SiO$_2$ is formed on the uppermost surface of the p-type contact layer. The mask is formed into a predetermined shape, the p-type semiconductor layer, the active layer, and a portion of the n-type semiconductor layer are etched by RIE (reactive ion etching) employing Cl$_2$ gas, and the surface of the n-type contact layer that will form the n-type electrode is exposed. In other words, as shown in FIG. 2A, the p-type semiconductor layer, the active layer, and a portion of the n-type semiconductor layer are removed and form two separate rectangular shapes and expose the n-contact layer. Note that when this occurs, resonator surfaces may be formed with the lateral surfaces of the exposed active layer.

Formation of the Ridge

Next, in order to form a stripe shaped waveguide region (current restriction region), a protective film comprising a silicon oxide (primarily SiO$_2$) is formed by means of a CVD device on approximately the entire surface of the uppermost layer of the p-type contact layer at a film thickness of 0.5 μm. After this, a mask of a predetermined shape is formed on top of the protective film by means of photolithography, CHF$_3$ gas is employed in the RIE device to produce a stripe shaped protective layer, and this protective layer is employed as a mask to form a stripe shaped ridge on the p-type contact layer.

Formation of the First Insulating Film

Next, the protective film is left as is, and a first insulating film comprising ZrO$_2$ is formed on the surface of the p-type layer. This first insulating film masks the surface on which the n-type ohmic electrode will be formed, and may be provided on the entire surface of the semiconductor layer. In addition, when the resonator surface is formed, the region where the first insulating film is not formed near the resonator surface may be arranged and be an approximately 10 μm stripe that is perpendicular to the ridge in order to make it easy to divide later.

After the first insulating film is formed, it is immersed in liquid BHF, the SiO$_2$ formed on the upper surface of the stripe shaped ridge is removed by dissolving, and both the SiO$_2$ and the ZrO$_2$ on the p-type contact layer (and on the n-type contact layer) are removed by the lift-off method. This provides a structure in which the upper surface of the stripe shaped ridge is exposed, and the lateral surfaces of the ridge are covered with ZrO$_2$.

Formation of the Ohmic Electrodes

Next, the p-type ohmic electrode is formed on top of the first insulating film on the uppermost surface of the ridge on top of the p-type contact layer. The p-type ohmic electrode is comprising Ni—Au. In addition, as shown in FIG. 2A, a separate type of n-type ohmic electrode is formed on the surface of the n-type contact layer exposed by etching. The n-type ohmic electrode is composed of Ti—Al. After these layers are formed, the p-type and the n-type ohmic electrodes are alloyed to obtain excellent ohmic characteristics by annealing at 600° C. each in a mixed atmosphere of oxygen and nitrogen. Note that it is preferred that the p-type ohmic electrode have a length that extends from one end of the device to the other, but the end surfaces of the p-type ohmic electrode may be disposed inside the end portions of the device when post-processing is taken into consideration.

Formation of the Second Insulating Film

Next, a resist is formed over the entire surface of the region on which the p-type ohmic electrode on top of the ridge and the n-type ohmic electrode are formed, and formed into the desired shape. A second insulating film comprising a silicon oxide (primarily SiO$_2$) is formed on the entire surface that includes the resist, and is then lifted off. This allows both the p-type ohmic electrode and a portion of the n-type ohmic electrode to be exposed.

Formation of the Pad Electrodes

Next, a p-type pad electrode and an n-type pad electrode are respectively formed so as to partially cover the second insulating film. These electrodes are composed of Ni—Ti—Au. These pad electrodes form the first electrode 13 and the second electrode 12 by connecting with the exposed ohmic electrodes in a stripe shape. Note that the pad electrode need not be formed to be the same length as the ohmic electrodes, e.g., the pad electrodes may be formed to a length such that the upper surface of the end portions of the ohmic electrodes are exposed.

Cleavage and Formation of the Resonator Surfaces

Figure 4:
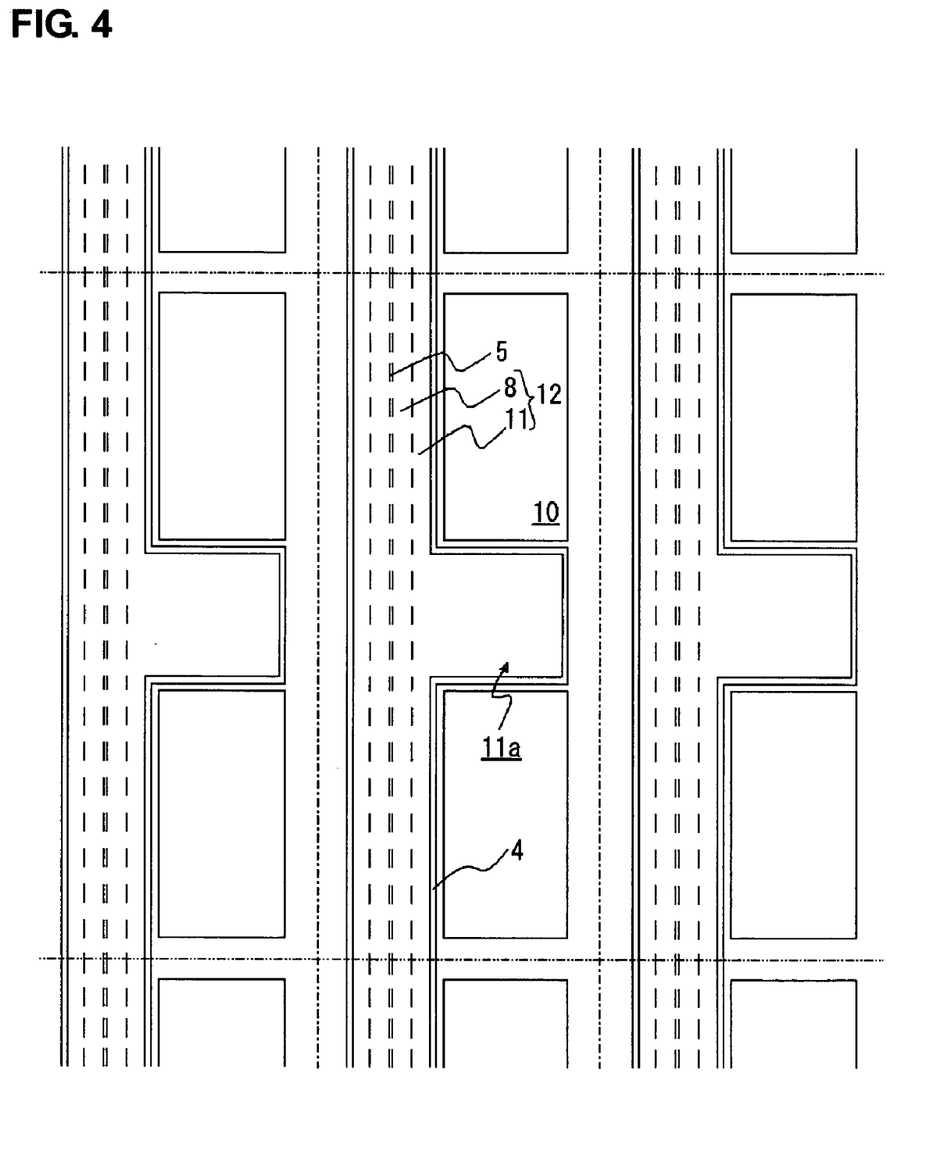
FIG. 4 shows the layout of the first electrode and the second electrode in the manufacturing steps of the semiconductor laser according to the present invention.

After the substrate is ground and polished to a thickness of approximately 150 μm, scribe grooves are formed in the rear surface of the substrate, and bar shaped lasers are obtained by performing cleavage in the positions shown by the dotted lines in FIG. 4 from the semiconductor layer side and repeatedly scribing from the substrate side. The cleaved surfaces of the semiconductor layers are M-plane (1100 oriented) semiconductors, and these surfaces can be resonator surfaces.

Formation of the End Surface Protective Layers

Light generated in the active layer will resonate with good efficiency on the resonator surfaces formed as described above, and in particular, in order to provide a refractive index difference with the resonator surface on the discharge side, a sputter device will be employed to form a protective film composed of $ZrO_2$ on the resonator surface on the monitor side, and then $SiO_2$ and $ZrO_2$ will be sequentially laminated in three pairs thereon to form a high reflectance film. Here, the film thickness of the protective film and the $SiO_2$ and $ZrO_2$ films that form the high reflectance film can be respectively set to a preferred thickness in accordance with the wavelength of the light generated from the active layer.

Next, grooves are formed by scribing in a direction parallel to the stripe shaped second electrode, and the bar-shaped semiconductor laser device of the present invention is obtained by breaking from the substrate side at the positions shown by the dotted lines in FIG. 4.

Evaluation of the Characteristics of the Semiconductor Laser Device

The characteristics of the semiconductor laser device obtained were evaluated.

The results were that a semiconductor laser device having current and voltage characteristics at 60° C. and an output of 30.6 mW which did not change even after approximately 700 hours of operation, and an excellent lifespan was confirmed.

In addition, with regard to the RCL characteristics of an average 25 chip laser device, C was confirmed to be low even though the R and L were the same as a comparative example.

Figure 5:
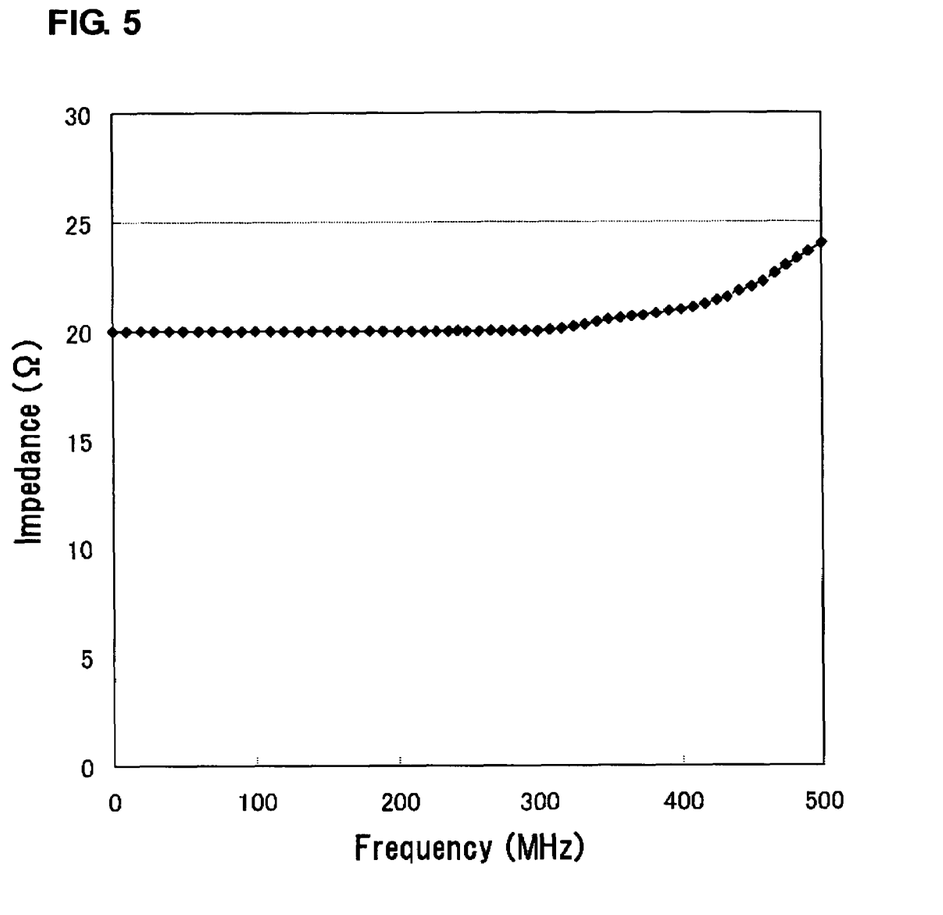
FIG. 5 is a graph showing the frequency and impedance characteristics of the semiconductor laser device according to the present invention.

Furthermore, as shown in FIG. 5, the frequency and impedance curve did not show a reduction in impedance in accordance with an increase in frequency, and thus results close to theoretical values were obtained.

Moreover, the threshold value could be reduced, and oscillation at a low current was made possible.

In addition, as shown in FIG. 4, by disposing the second electrode 12 and the first electrode 13 and the second conductive type semiconductor layer 4 and the ridge 5 that correspond thereto on a wafer to form a semiconductor laser device, approximately 1.5 times the number of devices can be secured, and the yield can be improved, compared to the prior art example.

Embodiment 2

As shown in FIG. 2B, the semiconductor laser device of this embodiment is substantially the same as the semiconductor laser device of FIGS. 1 and 2A, except that a portion of the n-type semiconductor layer 2 in the depth direction, the active layer 3, and the p-type semiconductor layer 4 are formed into a stripe shape, a second electrode 12' is formed on this laminated structure, and a projection 11a' of a pad electrode that forms the second electrode 12' is disposed across the top of the n-type semiconductor layer 2 via an insulating layer (not shown in the figure).

The semiconductor laser device described above can be formed by substantially the same method as described above. Note that after the pad electrode is formed, the semiconductor layers are etched by RIE until the sapphire substrate is exposed in a mesh pattern in order to make the semiconductor layers chip sized. At this point, the laser discharge surface will be etched directly in front of the laser discharge end surface in order to have an excellent FFP (far field pattern) during laser oscillation. After etching, the sapphire will be scribed from the rear surface thereof along the mesh that exposed the sapphire to obtain a laser chip.

INDUSTRIAL APPLICABILITY

The present invention can be used in all devices in which laser devices can be applied, such as CD players, MD players, various game devices, DVD players, trunk lines/optical communication systems such as telephone circuits and undersea cables, medical devices such as laser scalpels, laser treatment devices, and laser acupuncture devices, printing devices such as laser beam printers and displays, optical sensing devices such as various types of measurement devices, laser levels, laser length measuring devices, laser speed guns, and laser thermometers, and in various fields such as laser electric power transmission.

Any terms of degree used herein, such as "substantially" and "approximately", mean a reasonable amount of deviation of the modified term such that the end result is not significantly changed. These terms should be construed as including a deviation of at least ±5% of the modified term if this deviation would not negate the meaning of the word it modifies.

This application claims priority to Japanese Patent Application No. 2003-285813 and Japanese Patent Application No. 2004-185255 which are hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention are provided for illustration only, and not for the purpose of limiting the invention as defined by the appended claims and their equivalents.

What is claimed is:

1. A semiconductor laser device, comprising: a plurality of layers including a first conductive type semiconductor layer, an active layer, and a second conductive type semiconductor layer; a first electrode connected to said first conductive type semiconductor layer and a second electrode connected to said second conductive type semiconductor layer; wherein said second electrode comprises an ohmic electrode and a pad electrode, said ohmic electrode is ohmically connected to a portion of said second conductive type semiconductor layer in an ohmically connected region, and said pad electrode has a region for wire bonding; said first electrode is disposed on a common side of said first conductive type semiconductor layer as said second electrode, and said first electrode and said pad electrode are disposed in a common direction with respect to the ohmically connected region; and said second conductive type semiconductor layer has a predetermined width, wherein said second electrode comprising said ohmic electrode extends in a stripe shape, and said pad electrode is electrically connected to said ohmic electrode and projects in at least a first direction that is different from a second direction in which said ohmic electrode extends, wherein a projecting portion of said second conductive semiconductor layer projects in the first direction and said second electrode is disposed on top of said second conductive type semiconductor layer including the projecting portion.

2. The semiconductor laser device according to claim 1, wherein the region of said pad electrode for wire bonding has a surface area of 1000 µm² or greater.

3. The semiconductor laser device according to claim 1, wherein said pad electrode is disposed so as to divide said first electrode into two portions.

4. The semiconductor laser device according to claim 1, further comprising two first electrodes, wherein said pad electrode is sandwiched between said two first electrodes in the second direction.

5. The semiconductor laser device according to claim 1, wherein in the second direction, said pad electrode is arranged on one of two opposing end surfaces of the semiconductor laser device, and said first electrode is arranged on the other of the two opposing end surfaces of the semiconductor laser device.

6. The semiconductor laser device according to claim 1, wherein the region of said pad electrode for wire bonding has a surface area of 1000 µm² or greater.

7. The semiconductor laser device according to claim 1, wherein said second electrode extends to said first conductive type semiconductor layer through an insulating film disposed adjacent to said second electrode.

8. The semiconductor laser device according to claim 1, wherein the ohmically connected region is a stripe shaped ridge on a surface of said second conductive type semiconductor layer.

9. The semiconductor laser device according to claim 8, wherein said stripe shaped ridge is disposed from ends of said second conductive type semiconductor layer in a range between 2 and 50 times a width of said stripe shaped ridge.

10. The semiconductor laser device according to claim 1, wherein said first electrode is disposed in a region where at least a portion of said second conductive type semiconductor layer has been removed and said first conductive type semiconductor layer is exposed, and said first conductive type semiconductor layer has a width in a range between ½ to 10 times the width of said second conductive type semiconductor layer.

11. The semiconductor laser device according to claim 1, wherein said active layer and said second conductive type semiconductor layer have a surface area dimensioned so as to prevent hindering frequency-impedance characteristics of said semiconductor laser device.

12. The semiconductor laser device according to claim 1, further comprising a dummy layer that is electrically isolated from said second conductive type semiconductor layer connected to said second electrode and said active layer is disposed on top of said first conductive type semiconductor layer, wherein said dummy layer is disposed adjacent to a portion of said second electrode.

13. The semiconductor laser device according to claim 1, wherein said first conductive type semiconductor layer, said active layer, and said second conductive type semiconductor layer include a nitride semiconductor.

14. The semiconductor laser device according to claim 1, wherein said first conductive type semiconductor layer, said active layer, and said second conductive type semiconductor layer are disposed on a substrate, said first conductive type semiconductor layer is an n-type semiconductor, and said second conductive type semiconductor layer is a p-type semiconductor layer.

15. A semiconductor laser device, comprising: a plurality of layers including a first conductive type semiconductor layer, an active layer, and a second conductive type semiconductor layer; a first electrode connected to said first conductive type semiconductor layer and a second electrode connected to said second conductive type semiconductor layer; wherein said second electrode comprises an ohmic electrode and a pad electrode, said ohmic electrode extends in a stripe shape and is ohmically connected to a portion of said second conductive type semiconductor layer in an ohmically connected region, said pad electrode is electrically connected to said ohmic electrode, said pad electrode at least projects in a first direction different than a second direction in which said ohmic electrode extends, and said pad electrode has a region for electrically connecting to an external element; and said first electrode is disposed on a common side as said second electrode with respect to a surface of said first conductive type semiconductor layer, and is disposed in a common direction as said pad electrode with respect to the ohmically connected region, wherein in the second direction, said pad electrode is arranged on one of two opposing end surfaces of the semiconductor laser device, and said first electrode is arranged on the other of the two opposing end surfaces of the semiconductor laser device, wherein the ohmically connected region is a stripe shaped ridge on a surface of said second conductive type semiconductor layer.

16. The semiconductor laser device disclosed in claim 15, wherein the region of said pad electrode to electrically connect has a surface area of 1000 µm² or greater.

17. The semiconductor laser device according to claim 15, wherein said pad electrode is disposed so as to divide said first electrode into two portions.

18. The semiconductor laser device according to claim 15, further comprising two first electrodes, wherein said pad electrode is sandwiched between said two first electrodes in the second direction.

19. The semiconductor laser device according to claim 15, wherein a projecting portion of said second conductive type semiconductor layer projects in the first direction and said second electrode is disposed on top of said second conductive type semiconductor layer including the projecting portion.

20. The semiconductor laser device according to claim 15, wherein said second electrode extends to said first conductive type semiconductor layer through an insulating film disposed adjacent to said second electrode.

21. The semiconductor laser device according to claim 15, wherein said stripe shaped ridge is disposed from ends of said second conductive type semiconductor layer in a range between 2 and 50 times a width of said stripe shaped ridge.

22. The semiconductor laser device according to claim 15, wherein said first electrode is disposed in a region where at least a portion of said second conductive type semiconductor layer has been removed and said first conductive type semiconductor layer is exposed, and said first conductive type semiconductor layer has a width in a range between ½ to 10 times the width of said second conductive type semiconductor layer.

23. The semiconductor laser device according to claim 15, wherein said active layer and said second conductive type semiconductor layer have a surface area dimensioned so as to prevent hindering frequency-impedance characteristics of said semiconductor laser device.

24. The semiconductor laser device according to claim 15, further comprising a dummy layer that is electrically isolated from said second conductive type semiconductor layer connected to said second electrode and said active layer is disposed on top of said first conductive type semiconductor layer, wherein said dummy layer is disposed adjacent to a portion of said second electrode.

25. The semiconductor laser device according to claim 15, wherein said first conductive type semiconductor layer, said active layer, and said second conductive type semiconductor layer include a nitride semiconductor.

26. The semiconductor laser device according to claim 15, wherein said first conductive type semiconductor layer, said active layer, and said second conductive type semiconductor layer are disposed on a substrate, said first conductive type semiconductor layer is an n-type semiconductor, and said second conductive type semiconductor layer is a p-type semiconductor layer.

27. A semiconductor laser device, comprising:
a plurality of layers including a first conductive type semiconductor layer, an active layer, and a second conductive type semiconductor layer;
a first electrode connected to said first conductive type semiconductor layer and a second electrode connected to said second conductive type semiconductor layer;
wherein said second electrode comprises an ohmic electrode and a pad electrode, said ohmic electrode is ohmically connected to a portion of said second conductive type semiconductor layer in an ohmically connected region, and said pad electrode has a region for wire bonding;
said first electrode is disposed on a common side of said first conductive type semiconductor layer as said second electrode, and said first electrode and said pad electrode are disposed in a common direction with respect to the ohmically connected region;
said second conductive type semiconductor layer has a predetermined width to confine the light on both sides of the ohmically connected region;
wherein said second electrode comprising said ohmic electrode extends in a stripe shape, and said pad electrode is electrically connected to said ohmic electrode and a portion of said pad electrode projects in at least a first direction that is different from a second direction in which said ohmic electrode extends; and
wherein the region of said pad electrode for wire bonding has a surface area of 1000 µm² or greater.

28. A semiconductor laser device, comprising:
a plurality of layers including a first conductive type semiconductor layer, an active layer, and a second conductive type semiconductor layer;
a first electrode connected to said first conductive type semiconductor layer and a second electrode connected to said second conductive type semiconductor layer;
wherein said second electrode comprises an ohmic electrode and a pad electrode, said ohmic electrode extends in a stripe shape and is ohmically connected to a portion of said second conductive type semiconductor layer in an ohmically connected region, said pad electrode is electrically connected to said ohmic electrode, a portion of said pad electrode projects in a first direction different than a second direction in which said ohmic electrode extends, and said pad electrode has a region for electrically connecting to an external element;
said first electrode is disposed on a common side as said second electrode with respect to a surface of said first conductive type semiconductor layer, and is disposed in a common direction as said pad electrode with respect to the ohmically connected region; and
wherein the region of said pad electrode to electrically connect has a surface area of 1000 µm² or greater.

29. A semiconductor laser device, comprising:
a plurality of layers including a first conductive type semiconductor layer, an active layer, and a second conductive type semiconductor layer;
a first electrode connected to said first conductive type semiconductor layer and a second electrode connected to said second conductive type semiconductor layer;
wherein said second electrode comprises an ohmic electrode and a pad electrode, said ohmic electrode is ohmically connected to a portion of said second conductive type semiconductor layer in an ohmically connected region, and said pad electrode has a region for wire bonding;
said first electrode is disposed on a common side of said first conductive type semiconductor layer as said second electrode, and said first electrode and said pad electrode are disposed in a common direction with respect to the ohmically connected region;
said second conductive type semiconductor layer has a predetermined width to confine the light on both sides of the ohmically connected region; and
wherein said first electrode includes two main regions that electrically connected by a reduced thickness portion, and said pad electrode is disposed between said two main regions of said first electrode.

30. A semiconductor laser device, comprising:
a plurality of layers including a first conductive type semiconductor layer, an active layer, and a second conductive type semiconductor layer;
two first electrodes, each of said first electrodes being connected to said first conductive type semiconductor layer;
a second electrode connected to said second conductive type semiconductor layer;
wherein said second electrode comprises an ohmic electrode and a pad electrode, said ohmic electrode is ohmically connected to a portion of said second conductive type semiconductor layer in an ohmically connected region, and said pad electrode has a region for wire bonding;
said first electrode is disposed on a common side of said first conductive type semiconductor layer as said second electrode, and said first electrode and said pad electrode are disposed in a common direction with respect to the ohmically connected region;
said second conductive type semiconductor layer has a predetermined width to confine the light on both sides of the ohmically connected region; and
further comprising two first electrodes, wherein said pad electrode is sandwiched between said two first electrodes in the second direction.

* * * * *